(12) United States Patent
Hino et al.

(10) Patent No.: US 11,102,443 B2
(45) Date of Patent: Aug. 24, 2021

(54) TUNER MODULE AND RECEPTION APPARATUS

(71) Applicant: Sony Semiconductor Solutions Corporation, Kanagawa (JP)

(72) Inventors: Koki Hino, Tokyo (JP); Toyomi Fujino, Kanagawa (JP); Tadashi Imai, Kanagawa (JP); Makoto Watanabe, Tokyo (JP); Toshiyuki Sudo, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/490,102

(22) PCT Filed: Jan. 9, 2018

(86) PCT No.: PCT/JP2018/000163
§ 371 (c)(1),
(2) Date: Aug. 30, 2019

(87) PCT Pub. No.: WO2018/163588
PCT Pub. Date: Sep. 13, 2018

(65) Prior Publication Data
US 2020/0007812 A1    Jan. 2, 2020

(30) Foreign Application Priority Data
Mar. 6, 2017    (JP) .............................. JP2017-041605

(51) Int. Cl.
*H05K 7/00*   (2006.01)
*H04N 5/64*   (2006.01)
(Continued)

(52) U.S. Cl.
CPC ............. *H04N 5/64* (2013.01); *H05K 5/0217* (2013.01); *H05K 7/14* (2013.01)

(58) Field of Classification Search
USPC ......................................... 361/818, 816, 799
See application file for complete search history.

(56) References Cited

U.S. PATENT DOCUMENTS

| 4,628,412 A  * | 12/1986 | Nigorikawa ........... H05K 9/006 |
| | | 361/816 |
| 6,347,044 B1 * | 2/2002 | Won ...................... G06F 1/1616 |
| | | 174/138 G |

(Continued)

FOREIGN PATENT DOCUMENTS

| CN | 203522900 | 4/2014 |
| CN | 106463807 | 2/2017 |

(Continued)

OTHER PUBLICATIONS

International Search Report and Written Opinion and English translations thereof dated Mar. 20, 2018 in connection with International Application No. PCT/JP2018/000163.

(Continued)

*Primary Examiner* — Hung S. Bui
(74) *Attorney, Agent, or Firm* — Wolf, Greenfield & Sacks, P.C.

(57) ABSTRACT

Provided is a tuner module including: a casing body adapted to house a tuner module board on which a tuner function unit is formed; and at least one antenna connector fixed to the casing body and having a terminal portion of a center electrode connected to the tuner module board, in which the casing body includes a plate-like portion formed with a hole portion into which a screw member is inserted, and a plurality of protrusions is provided apart from each other at a peripheral portion of the hole portion.

12 Claims, 13 Drawing Sheets

(51) Int. Cl.
*H05K 5/02* (2006.01)
*H05K 7/14* (2006.01)

(56) References Cited

U.S. PATENT DOCUMENTS

| | | | |
|---|---|---|---|
| 6,737,711 B1* | 5/2004 | Adan | H01L 21/8221 |
| | | | 257/390 |
| 7,533,178 B2* | 5/2009 | Henniger | H04L 67/14 |
| | | | 709/227 |
| 8,116,101 B2* | 2/2012 | Chang | G06F 1/1656 |
| | | | 174/371 |
| 8,767,410 B2* | 7/2014 | Yamamoto | G06F 1/183 |
| | | | 174/263 |
| 2009/0098837 A1 | 4/2009 | Kohno et al. | |
| 2014/0160709 A1 | 6/2014 | Imai et al. | |

FOREIGN PATENT DOCUMENTS

| | | |
|---|---|---|
| JP | 11-051029 A | 2/1999 |
| JP | 2009-100151 A | 5/2009 |
| JP | 2011-222447 A | 11/2011 |
| JP | 2013-042311 A | 2/2013 |
| WO | WO 2012/005065 A1 | 1/2012 |
| WO | WO-2014061927 A1 | 4/2014 |

OTHER PUBLICATIONS

International Preliminary Report on Patentability and English translation thereof dated Sep. 19, 2019 in connection with International Application No. PCT/JP2018/000163.

\* cited by examiner

FIG. 1
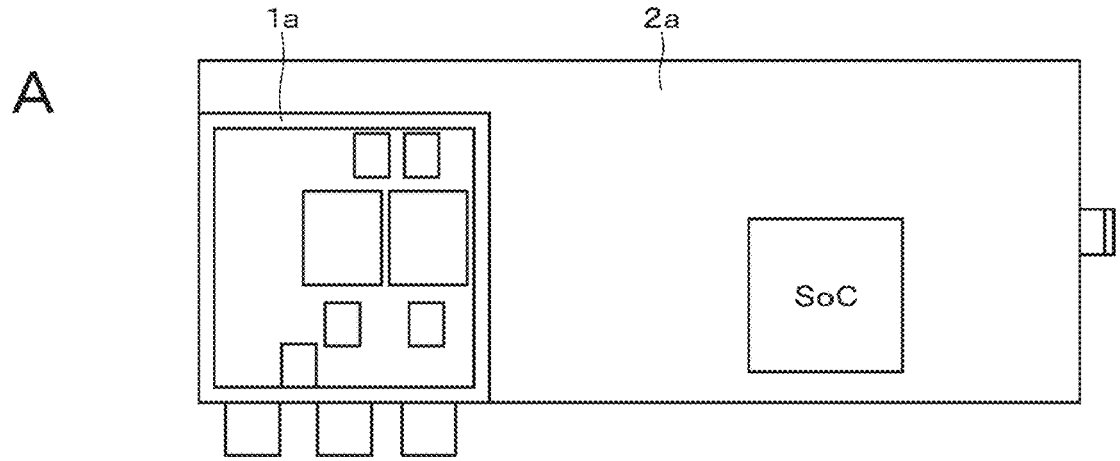
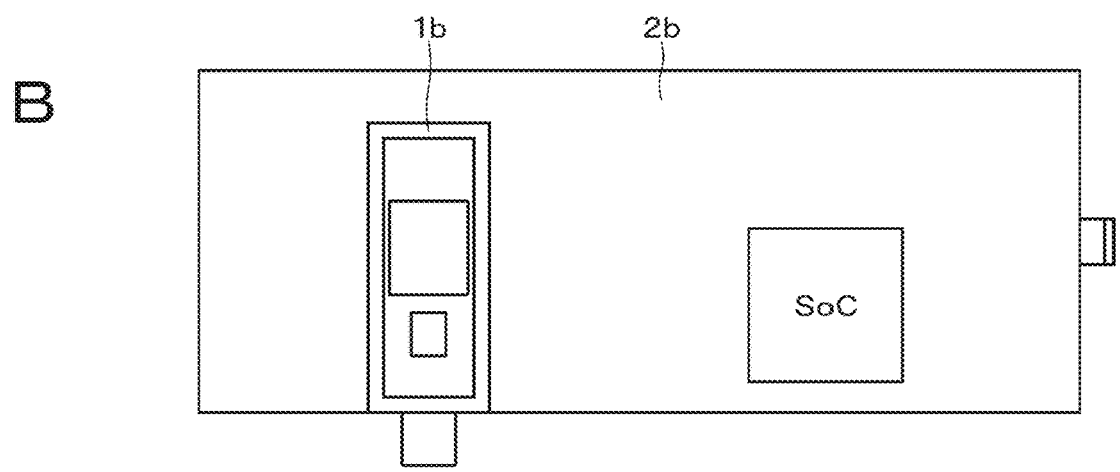
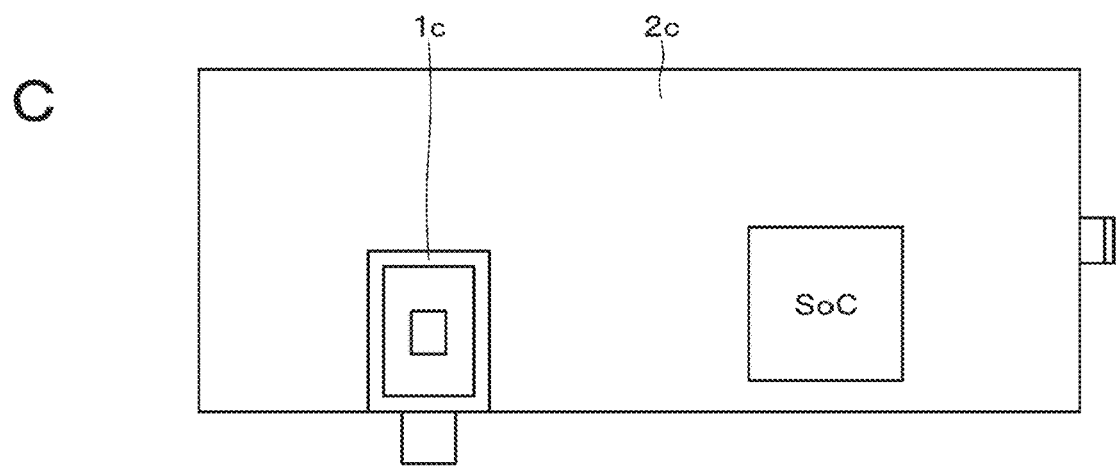

FIG. 4
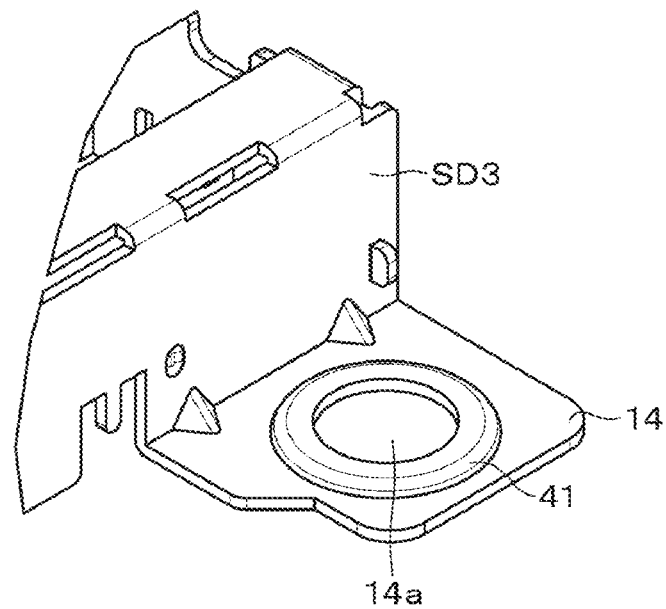
A
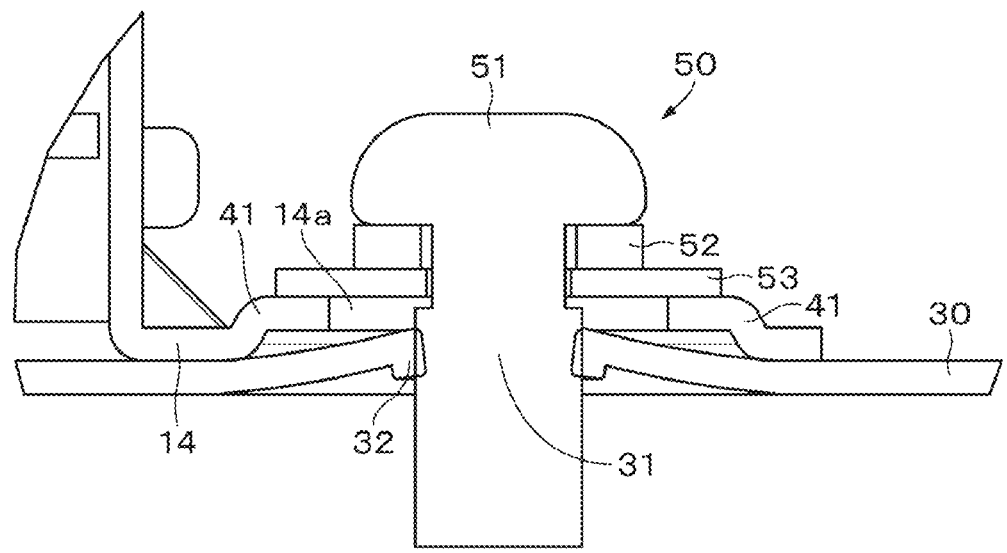
B

FIG. 5
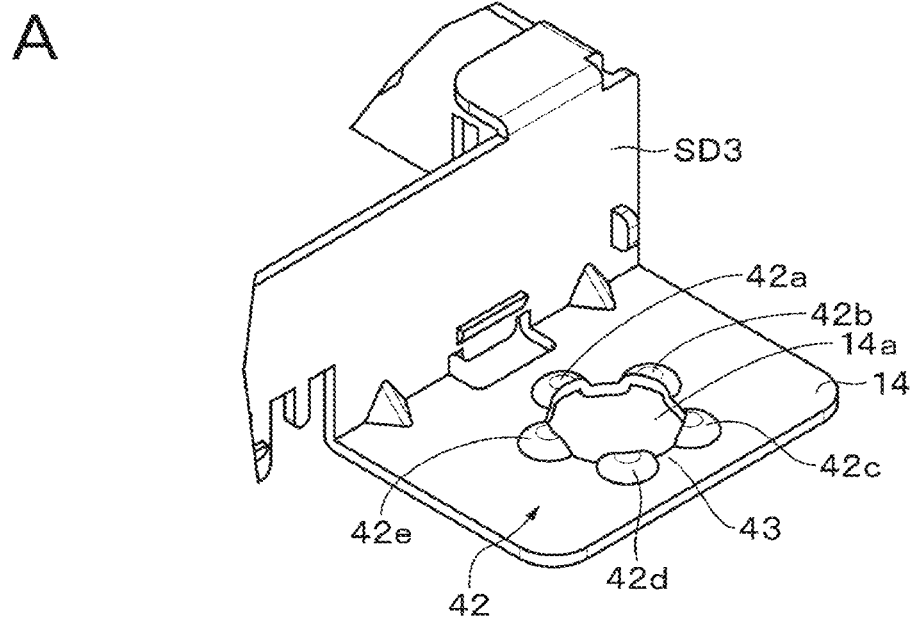
A
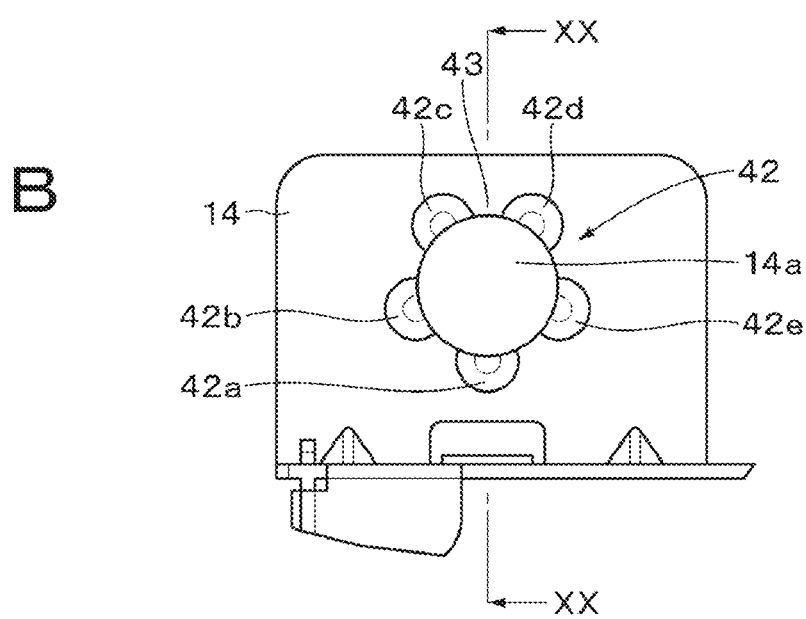
B

FIG. 6
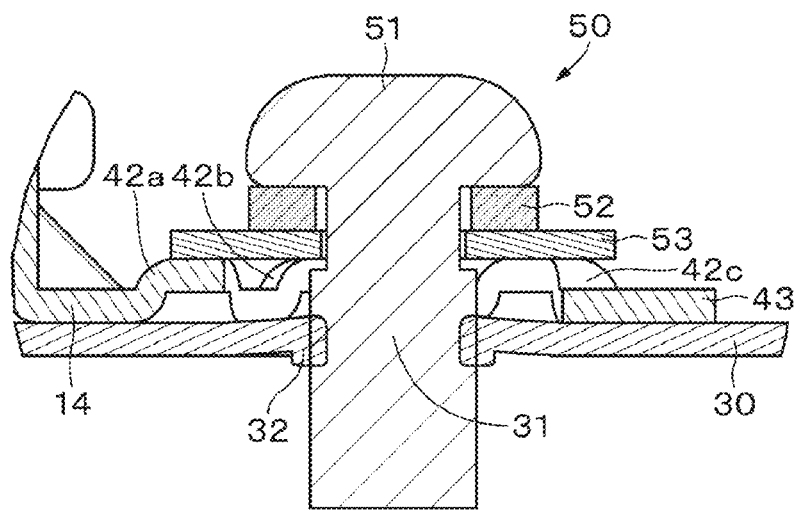
A
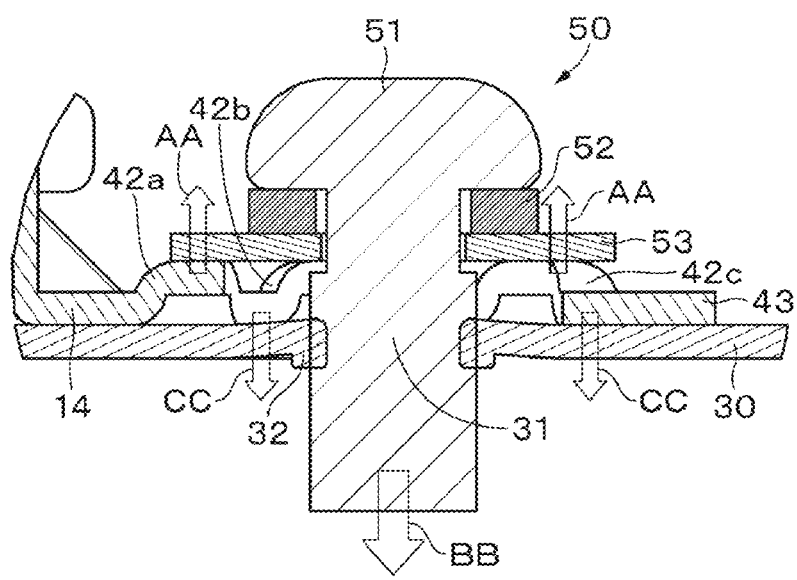
B

FIG. 7
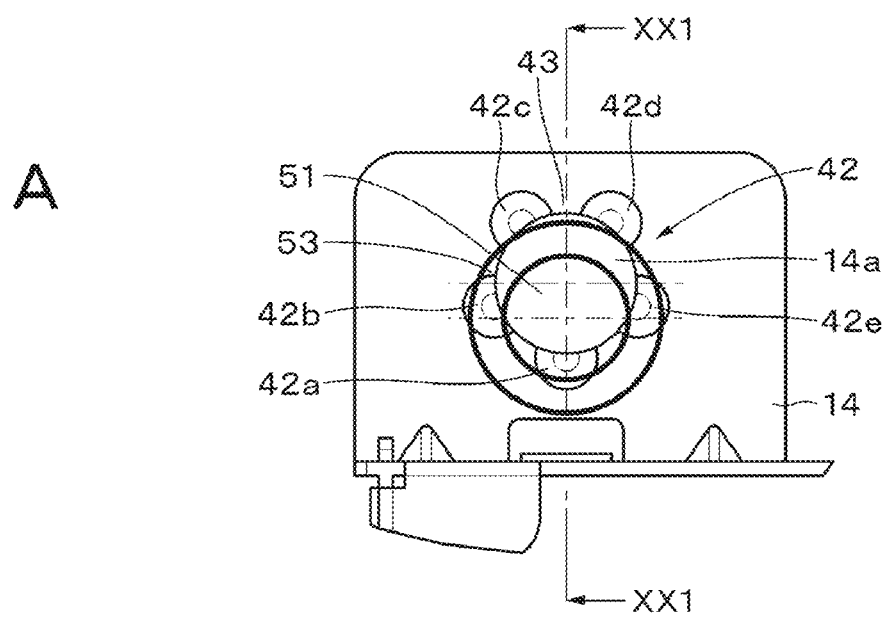
A
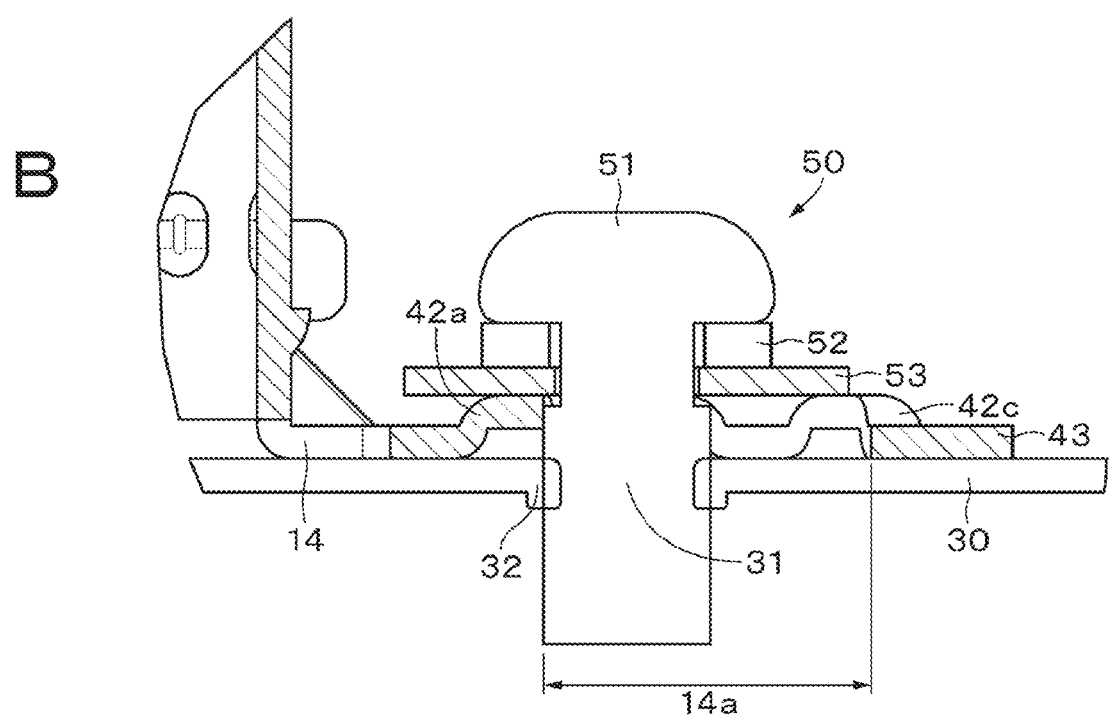
B

FIG. 10
A
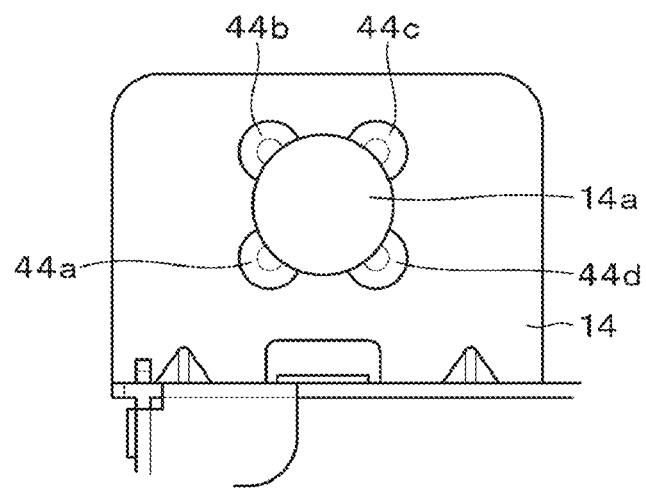
B
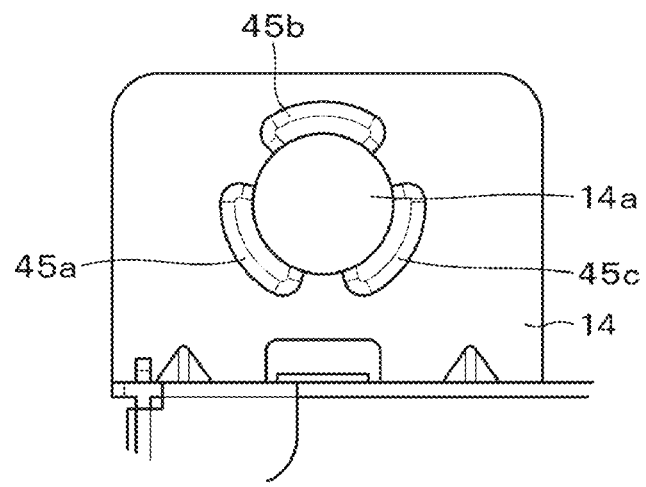

FIG. 11
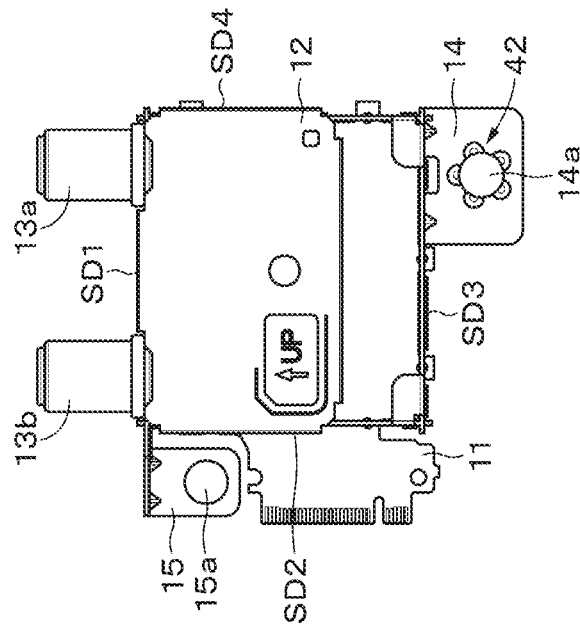
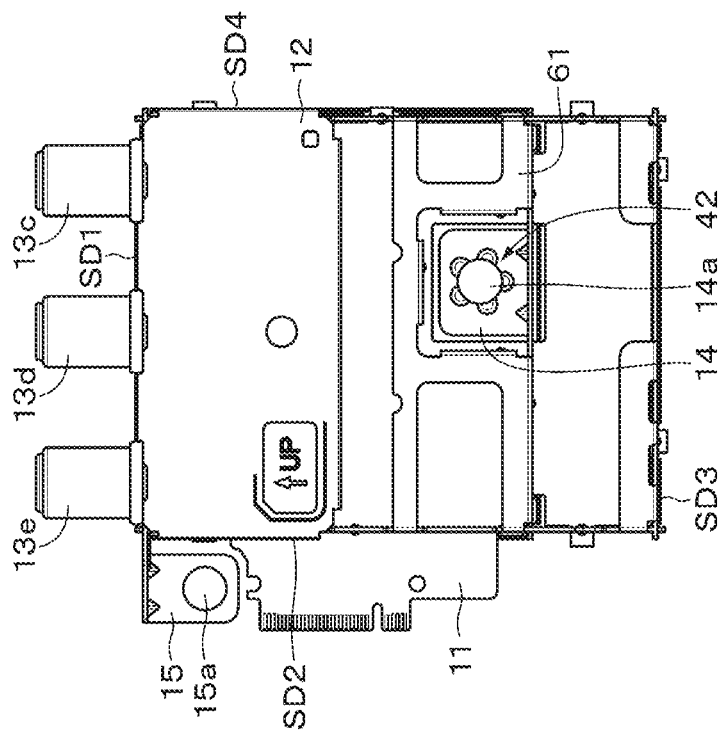

TUNER MODULE AND RECEPTION APPARATUS

CROSS-REFERENCE TO RELATED APPLICATIONS

This application claims the benefit under 35 U.S.C. § 371 as a U.S. National Stage Entry of International Application No. PCT/JP2018/000163, filed in the Japanese Patent Office as a receiving Office on Jan. 9, 2018, which claims priority to Japanese Patent Application Number JP2017-041605, filed in the Japanese Patent Office on Mar. 6, 2017, each of which is hereby incorporated by reference in its entirety.

TECHNICAL FIELD

The present disclosure relates to a tuner module and a reception apparatus.

BACKGROUND ART

As a tuner module used for a television set or the like, there is a proposed tuner module disclosed in Patent Document 1, for example. In the tuner module disclosed in Patent Document 1, a pin portion thereof is inserted into a hole of a circuit board and then the pin portion is mounted on the circuit board by soldering.

CITATION LIST

Patent Document

Patent Document 1: Japanese Patent Application Laid-Open No. 2013-42311

SUMMARY OF THE INVENTION

Problems to be Solved by the Invention

When a fixing method of Patent Document 1 is used, for example, in a case where there are variations in a board to which a tuner module is equipped, there is a problem that design and experimental production of the board are required every time the variation is made. Furthermore, in general, it is desired that the tuner module be mounted by using equipment and a method which are as simple as possible.

One of the objects of the present disclosure is to provide a tuner module and a reception apparatus to which a board or the like can be mounted by using equipment and a method which are as simple as possible.

Solutions to Problems

The present disclosure is, for example, a tuner module including:
a casing body adapted to house a tuner module board on which a tuner function unit is formed; and
at least one antenna connector fixed to the casing body and having a terminal portion of a center electrode connected to the tuner module board, in which
the casing body includes a plate-like portion formed with a hole portion into which a screw member is inserted, and a plurality of protrusions is provided apart from each other at a peripheral portion of the hole portion.

The present disclosure is, for example, a reception apparatus including:
the tuner module described above; a metal chassis on which the tuner module is mounted by the screw member; and a board to which the tuner module board is connected.

Effects of the Invention

According to at least one embodiment of the present disclosure, the tuner module can be securely mounted on the board and the metal chassis by using the equipment and the method which are as simple as possible. Note that the effect recited herein is not necessarily limited and may be any effect recited in the present disclosure. Furthermore, the content of the present disclosure should not be understood in a manner limited by the exemplified effects.

BRIEF DESCRIPTION OF DRAWINGS

FIGS. 1A, 1B, and 1C are diagrams schematically illustrating a tuner module connected to a reception board.
FIG. 4A is a view illustrating a shape of a general embossed portion,
and FIG. 4B is a view to describe a phenomenon caused by the shape of the general embossed portion.
FIG. 5A is a perspective view to describe the embossed portion according to the first embodiment of the present disclosure,
and FIG. 5B is a top plan view to describe the embossed portion according to the first embodiment of the present disclosure.
FIG. 6A is a cross-sectional view illustrating a state in which a screw is screwed in the first embodiment of the present disclosure,
and FIG. 6B is a view to describe action of force in the state in which the screw is screwed.
FIGS. 7A and 7B are views each illustrating a state in which a place to screw a screw deviates.
FIGS. 10A and 10B are views to describe modified examples of the first embodiment.
FIGS. 11A and 11B are diagrams to describe modified examples of the first embodiment.

MODE FOR CARRYING OUT THE INVENTION

Figure 2:
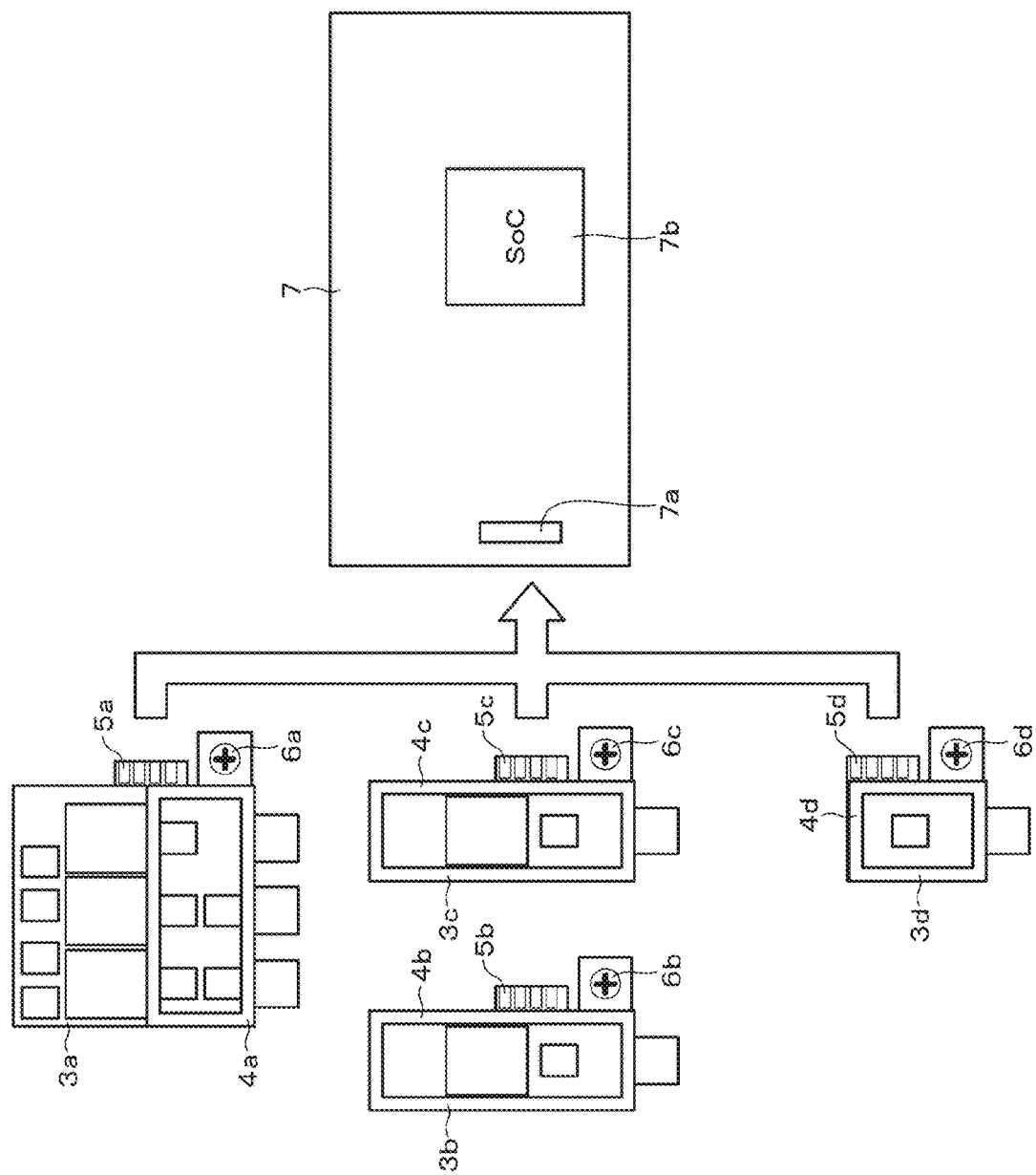
FIG. 2 is a diagram to describe a technology associated with the present disclosure.

In the following, embodiments and the like of the present disclosure will be described with reference to the drawings. Note that the description will be provided in the following order.

<1. First Embodiment>
<2. Second Embodiment>
<3. Modified Examples>

Note that the embodiments and the like described below are preferable specific examples of the present disclosure and the content of the present disclosure is not limited to these embodiments and the like.

Furthermore, in the following description, a reference sign may be provided to only a part of the configuration or a part of the configuration may be simply illustrated in order to prevent complex illustration. Furthermore, hatching indicating a cross-section may be omitted as appropriate in a cross-sectional view.

1. First Embodiment

[Technology Associated with Present Disclosure]

First, a technology associated with the present disclosure will be described for easy understanding of the present disclosure. Note that, in the following description, a description will be provided by exemplifying a tuner module connected to a board of a television set (hereinafter referred to as a reception board as appropriate).

FIGS. 1A to 1C schematically illustrate a tuner module connected to a reception board. A tuner module 1a in FIG. 1A is a two-circuit (dual) tuner module and conforming to the digital video broadcasting-terrestrial (DVB-T) 2 standard. A tuner module 1b in FIG. 1B is a single circuit tuner module conforming to the DVB-T2 standard. A tuner module 1c in FIG. 1C is a tuner module conforming to the DVB-T standard.

A reception board 2a in FIG. 1A is a board on which a circuit (circuit supporting dual input) to process a broadcast signal conforming to the DVB-T2 standard is mounted. A reception board 2b in FIG. 1B is a board on which a circuit (circuit supporting single input) to process a broadcast signal conforming to the DVB-T2 standard is mounted. A reception board 2c in FIG. 1C is a board on which a circuit to process a broadcast signal conforming to the DVB-T standard is mounted. The reception boards 2a to 2c are generally provided on a rear side of a display of the television set. As described above, a corresponding tuner module is mounted on each reception board by soldering.

In recent reception boards, digital signal processing is executed by an integrated circuit (IC) called system on chip (SoC) mounted on the reception board, and switch of a receiving function is executed by software control. By the way, a channel selection circuit portion built inside a tuner module is required to be a different model in order to support a different frequency allocation that is different in each nation and each region, or required to be a different model due to variations of specifications, such as the single-circuit reception and the dual-circuit redirection, and therefore, usage is changed in accordance with a type of tuner module. In other words, despite a fact that circuits have the same configuration using the same SoC, it is necessary to prepare the number of types of reception boards (three types in the present example) same as the number of the types of tuner modules to be mounted.

Considering such situations, in the present embodiment, a tuner module is electrically connected to a reception board by using a connection method described below. The connection method in the present embodiment will be described with reference to FIG. 2. A tuner module 3a in FIG. 2 is a three-circuit tuner module conforming to the DVB-T2 standard. Each of tuner modules 3b and 3c is a single circuit tuner module conforming to the DVB-T2 standard. However, the tuner modules 3b and 3c have different version numbers, and have different internal configurations despite having the same outer shape. A tuner module 3d is a single circuit tuner module conforming to the DVB-T.

The tuner module 3a includes a metal casing body 4a. A tuner module board in which a tuner function unit is formed is housed inside the casing body 4a. A terminal portion 5a of the tuner module board is exposed to the outside of the casing body 4a. Furthermore, a screw fastening portion 6a is provided at an end portion (for example, a place in the vicinity of a place where the terminal portion 5a is exposed) of the casing body 4a. Similarly, the tuner module 3b includes a casing body 4b. A terminal portion 5b of the tuner module board is exposed to the outside of the casing body 4b, and a screw fastening portion 6b is provided at an end portion of the casing body 4b. The tuner module 3c includes a casing body 4c. A terminal portion 5c of the tuner module board is exposed to the outside of the casing body 4c, and a screw fastening portion 6c is provided at an end portion of the casing body 4c. The tuner module 3d includes a casing body 4d. A terminal portion 5d of the tuner module board is exposed to the outside of the casing body 4d, and a screw fastening portion 6d is provided at an end portion of the casing body 4d.

A reception board 7 includes a connector 7a and a SoC 7b. The connector 7a and the SoC 7b are electrically connected by a circuit pattern not illustrated. For example, the terminal portions 5a, 5b, 5c, and 5d of the boards have a common configuration, and each of the terminal portions can be connected to the connector 7a. With this configuration, a plurality of types of tuner modules can be connected to the common reception board 7. Note that, mounting strength obtained by mounting only to the connector 7a may be more insufficient than mounting strength obtained by mounting by soldering. Accordingly, the tuner module 3a is fastened to the reception board 7 with a screw by using the screw fastening portion 6a so as to compensate the mounting strength. Other tuner modules 3b and the like are also similar to the tuner module 3a.

With use of the above connection method, many advantages can be obtained. For example, a soldering process becomes unnecessary. The soldering process used to mount the tuner module requires special equipment, such as applying solder to around a hole of the reception board by printing or the like, and then passing the soldered part through a high-temperature reflow furnace. However, the present connection method is a simple method in which it is sufficient to insert each terminal portion into a connector and fasten each tuner module to the reception board with a screw.

Another advantage is that there is no need to prepare a plurality of variations of reception boards. In other words, there is no need to use the three types of reception boards as exemplified in FIG. 1, and the plurality of tuner modules can be mounted on one reception board as illustrated in FIG. 2. Accordingly, it is possible to largely save expense, a time, a material cost, and the like in development of a reception board. Moreover, since the development time and manufacturing equipment can be simplified, a person involved in the development and the manufacturing is not required to have a high skill, and facilities, equipment, and tools can also be simplified, and therefore, cost reduction can be achieved in carrying out business.

The technology associated with the present disclosure has been described above. Embodiments of the present disclosure will be described in detail on the basis of these technologies.

Exemplary Configuration of Tuner Module

Figure 3:
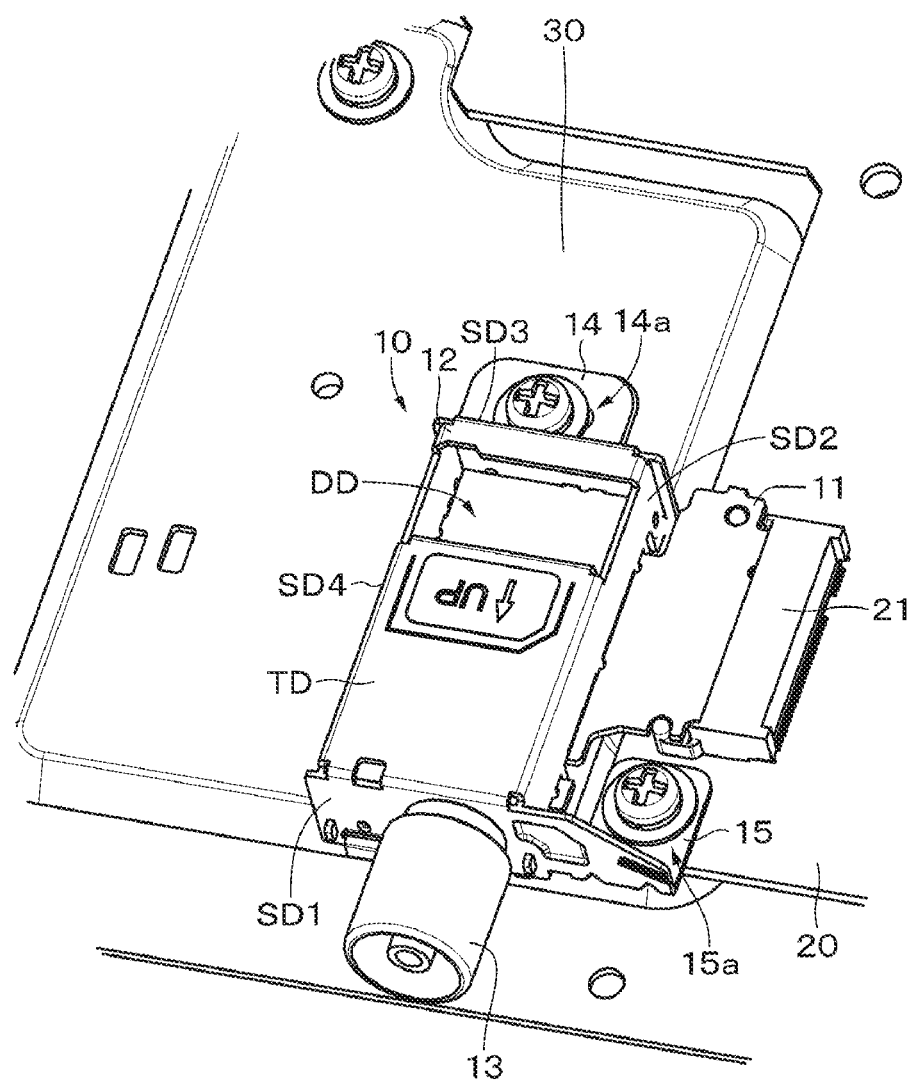
FIG. 3 is a perspective view to describe a tuner module according to a first embodiment of the present disclosure.

FIG. 3 is a view to describe a tuner module (tuner module 10) according to a first embodiment of the present disclosure. The tuner module 10 is mounted on a television set that is an exemplary reception apparatus. The television set includes, on a rear side, a reception board 20 and a metal chassis 30 to which the reception board 20 is mounted. FIG. 3 illustrates a state in which the tuner module 10 is mounted on the reception board 20 and the metal chassis 30 of the television set.

The tuner module 10 includes: a tuner module board 11 in which a tuner function unit is formed; and a tuner casing 12 (casing body) in which the tuner module board 11 is housed and a function as a shield casing is provided.

The tuner casing 12 is formed in a structure having a substantially box-shaped housing space and includes an upper surface portion TD and a bottom surface portion DD. Note that the wordings of the upper surface portion and the bottom surface portion are provided for convenience of description, and the upper surface portion and the bottom surface portion are not necessarily positioned on an upper side and a lower side respectively in a use state of the tuner module 10. The upper surface portion TD of the tuner casing 12 is partly opened so as to facilitate inspection of an IC and the like mounted on the tuner module board 11.

Furthermore, the tuner casing 12 has a substantially frame shape including side portions SD1, SD2, SD3, and SD4 formed at an edge portion of the substantial box shape and each having a surface substantially perpendicular to the tuner module board 11. On a surface corresponding to each of the side portions SD, a hole portion, a protrusion, a lock piece, and the like may be provided as appropriate in accordance with a type of a tuner module or the like.

The tuner module 10 includes an antenna connector 13 fixed to the tuner casing 12 and having a center electrode (core wire) connected to the tuner module board 11. The antenna connector 13 has a substantially cylindrical shape and is connected to a surface on the side portion SD1 side by caulking, for example.

An opening is formed on a surface constituting the side portion SD2, and a part of the tuner module board 11 is exposed through the opening to the outside of the tuner casing 12 from the side portion SD2 side. A terminal portion formed in the vicinity of an end portion in the place where the tuner module board 11 is exposed is located outside the tuner casing 12. This terminal portion is connected to a connector 21 provided on the reception board 20 as illustrated in FIG. 3. As described above, another type of tuner module that is different from the tuner module 10 also has a terminal portion, and the terminal portion can be connected to the connector 21. Advantages obtained by the configuration in which the terminal portions of the different types of tuner modules can be connected to the common connector (the connector 21 in the present example) are as described above.

The tuner module 10 includes a first plate-like portion 14 and a second plate-like portion 15. The first plate-like portion 14 extends, for example, toward the outside of the tuner casing 12 from the side portion SD3 side located on the opposite side of the side portion SD1. The first plate-like portion 14 is formed by, for example, bending a surface constituting the side portion SD3 at approximately 90 degrees. The first plate-like portion 14 includes a hole portion 14a into which a screw that is an exemplary screw member is inserted.

The second plate-like portion 15 is formed by, for example, bending a part of a surface constituting the side portion SD1 at approximately 90 degrees, and is arranged in the vicinity of the terminal portion of the tuner module board 11. The second plate-like portion 15 includes a hole portion 15a into which a screw is inserted. The upper surface portion TD, the bottom surface portion DD, the side portions SD1 to SD4, the first plate-like portion 14, and the second plate-like portion 15 constituting the tuner casing 12 are formed by performing pressing work for one plate-like metal, for example.

In the reception board 20 and the metal chassis 30, hole portions corresponding to the hole portions 14a and 15a are formed. For example, the tuner casing 12 is fastened to the reception board 20 and the metal chassis 30 with a screw by screwing the screw into: the hole portion 15a; the hole portion formed in the reception board 20 and corresponding to the hole portion 15a; and the hole portion formed in the metal chassis 30 and corresponding to the hole portion 15a. Such screw fastening is screw fastening to compensate strength of connector connection as described above.

On the other hand, the tuner casing 12 is directly fastened to the metal chassis 30 with a screw by screwing the screw into: the hole portion 14a; and the hole portion formed in the metal chassis 30 and corresponding to the hole portion 14a. Such screw fastening is manually carried out, for example, but may also be automatically carried out by a machine. Note that, in the present embodiment, the screw members to be inserted into the hole portions 14a and 15a are the screw members which are common (have the same shape). With these common screw members, it is possible to prevent a mounting failure of the tuner module 10 due to a selection mistake of a screw member.

Since the tuner casing 12 is directly fastened to the metal chassis 30 with the screw, mechanical fixation and electrical contact with ground potential can be achieved. The mechanical fixation is important to accurately position the antenna connector 13. Furthermore, the metal chassis 30 of the television set is the largest metal component inside the set. Due to this, stable reference potential having an electrically uniform potential can be achieved, and therefore, the metal chassis 30 is normally connected to the ground potential. Since it is designed such that the tuner casing 12 that is directly fastened to the metal chassis 30 with the screw and contacts the metal chassis can have the ground potential in the circuit of the tuner module 10, the circuit of the tuner module 10 can be operated with the ground potential common with the reference potential of the television set.

Influence from Mounting Failure

Here, influence from mounting failure in which the tuner casing 12 is not properly mounted on the metal chassis 30 will be described. In a case where connection by fastening the tuner casing 12 to the metal chassis 30 with the screw is unstable, there is a possibility that the ground potential in the circuit of the tuner module 10 differs from the ground potential in the circuit of the television set. In a case where the ground potential is different, such a potential difference adversely affects the circuit in each of the television set and the tuner module 10 as noise, and causes unnecessary radiation noise.

One of causes of such mounting failure will be described with reference to FIGS. 4A and 4B. The second plate-like portion 15 is mounted on the reception board 20 and the metal chassis 30. On the other hand, the first plate-like portion 14 is mounted only on the metal chassis 30. To absorb this level difference, an embossed portion 41 is provided on a periphery of the hole portion 14a. The embossed portion 41 projects toward an upper surface from a bottom surface (surface on the metal chassis 30 side in the mounted state) of the first plate-like portion 14, and generally has a circumferential shape as illustrated in FIG. 4A.

FIG. 4B is a cross-sectional view illustrating a state in which the tuner casing 12 is mounted on the metal chassis 30 by a screw member 50. The screw member 50 in the present example includes a screw 51, a spring washer 52, and a washer 53. As the screw 51 in the present embodiment, a screw having a size corresponding to a standard called M3 is used. The screw 51 is screwed while putting the spring washer 52, the washer 53, and the washer 53 on the first plate-like portion 14 side. Contact pressures by the screw 51 and the washer 53 are made uniform by the spring washer 52, and a positional deviation between the hole portion 14a and a hole portion 31 of the metal chassis 30 is absorbed by the washer 53. A burring portion 32 is formed on the metal chassis 30 by performing a burring work in order to secure a thickness and form a screw thread.

As illustrated in FIG. 4B, a contact portion where the first plate-like portion 14 contacts the metal chassis 30 further serves as an outer circumference portion of the embossed portion 41 provided in an outer circumference of the hole portion 14a. Therefore, the burring portion 32 is pulled by the screw thread of the screw 51 by upward force acting at the time of screwing the screw 51, and a part of the metal chassis 30 is plastically deformed upward. In the burring portion 32 of the plastically-deformed metal chassis 30, some problems may occur, for example, stress in a diagonal direction is applied to the screw thread, a diameter of the hole portion 14a is increased or the screw thread is ruined, and the screw 51 comes off.

Furthermore, since the screw 51 is fixed to the hole portion 31 of the metal chassis 30, a diameter of the hole portion 14a is formed larger than the diameter of the hole portion 31, considering dimensional tolerance, production tolerance, and the like of each of the metal chassis 30 and the tuner casing 12. Therefore, since contact area is further reduced due to the circumferential embossed portion 41 while contact area of the first plate-like portion 14 and the metal chassis 30 tends to be small, there is a high possibility that force to suppress deformation of the metal chassis 30 hardly acts, and the metal chassis 30 is deformed.

Regarding Embossed Portion According to Present Embodiment

FIGS. 5A and 5B are views to describe the embossed portion (embossed portion 42) in the tuner module according to the present embodiment. FIG. 5A is a perspective view to describe an exemplary configuration of the embossed portion 42, and FIG. 5B is a top view to describe the exemplary configuration of the embossed portion 42. The embossed portion 42 according to the present embodiment has a configuration in which a plurality of protrusions is provided apart from each other at a peripheral portion of the hole portion 14a of the first plate-like portion 14. For example, as illustrated in FIG. 5A, the embossed portion 42 has a flower-like shape in which five protrusions (protrusions 42a to 42e) are circumferentially provided (along the circumference). The five protrusions 42a to 42e protrude toward the upper surface from the bottom surface of the first plate-like portion 14 (the surface located on the metal chassis 30 side in the mounted state).

FIGS. 6A and 6B are cross-sectional views each illustrating a cross-section taken along a line XX-XX in FIG. 5B. As the screw member in the present example, a member including a screw 51, a spring washer 52, and a washer 53 is used similar to the above-described screw member. As illustrated in FIG. 6B, the protrusions 42a to 42e of the embossed portion 42 abut on the washer 53, and stress (force in a direction of an arrow direction AA) and downward stress (force in a direction of an arrow direction BB) at the time of screwing of the screw 51 are balanced.

Here, area in which the embossed portion 42 and the washer 53 according to the present embodiment contact each other is smaller than area in which the embossed portion 41 including the protrusions provided along the entire circumference and the washer 53 contact each other. In other words, area in which the first plate-like portion 14 and the metal chassis 30 contact each other is increased. For example, as illustrated in FIG. 6A, a flat portion 43 located between, for example, the protrusion 42c and the protrusion 42d contacts the metal chassis 30. A flat portion between the remaining protrusions is also similar to the flat portion 43. The area in which the first plate-like portion 14 and the metal chassis 30 contact each other is increased by the area of these flat portions. Since the contact area of the first plate-like portion 14 and the metal chassis 30 is increased, force (force in a direction of an arrow CC in FIG. 6B) acting against force acting at the time of screwing the screw 51 and lifting up the metal chassis 30 is increased. Therefore, deformation of the metal chassis 30 can be prevented.

Even in a case where the screw 51 is mounted/dismounted, the deformation of the metal chassis 30 and the like is eliminated, and therefore, the different types (shapes) of tuner modules can be easily replaced. For example, since the tuner module can be easily replaced even in a case where a tuner module is a defective product, it is possible to improve serviceability of a product. Furthermore, since a tuner module in a design stage can be also easily replaced, man-hours for development can be shortened.

By the way, there may be a case where a center of the hole portion 31 of the metal chassis 30 deviates from a center of the hole portion 14a of the first plate-like portion 14. Such deviation is generally caused by tolerance of the tuner casing 12, manufacture tolerance of the tuner module board and the tuner casing 12, and the like. Particularly, in a case of assuming a mode in which tuner modules having different sizes are connected to the same reception board, a size of the hole portion 14a to a certain extent is required.

Thus, even in the case where the center of the hole portion 31 of the metal chassis 30 deviates from the center of the hole portion 14a of the first plate-like portion 14, the screw 51 can be securely set. FIG. 7A is a view illustrating a state in which the screw 51 is screwed in a state in which the center of the hole portion 31 of the metal chassis 30 deviates from the center of the hole portion 14a of the first plate-like portion 14, and FIG. 7B is a view illustrating a cross-section taken along a cut line XX1-XX1 in FIG. 7A.

As illustrated in FIG. 7A, even in the case where the screw 51 is screwed in the state where the center of the hole portion 31 of the metal chassis 30 deviates from the center of the hole portion 14a of the first plate-like portion 14, the washer 53 is supported by three support points (protrusions 42a, 42b, and 42e). Moreover, as illustrated in FIG. 7B, the washer 53 can keep a substantially horizontal state in the state in which the screw 51 is set. The substantially horizontal state means a state in which the washer 53 is in the horizontal state or in a state slightly inclined from the horizontal state to such an extent in which there is no problem in attaching/detaching the screw 51. As far as this state can be kept, setting failure of the screw 51 caused by inclination of the washer 53 can be prevented.

Figure 8:
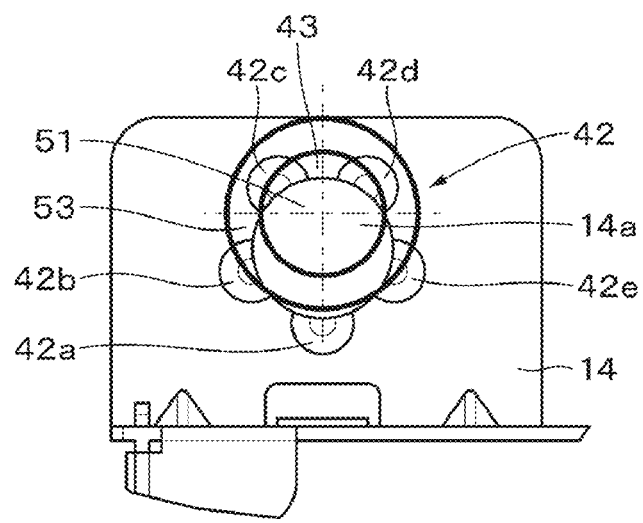
FIG. 8 is a view to describe that protrusions support a washer even in a case where the place to screw the screw deviates.
Figure 9:
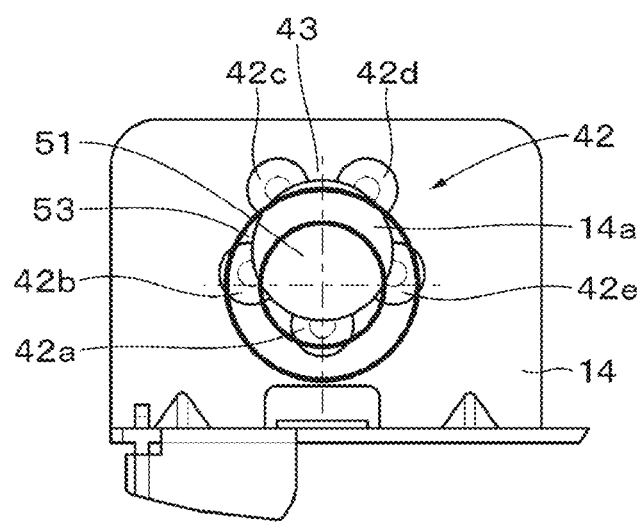
FIG. 9 is a view to describe that the protrusions support the washer even in the case where the place to screw the screw deviates.

As illustrated in FIGS. 8 and 9, a place into which the screw 51 is to be screwed may deviate in various directions. FIG. 8 is a view illustrating an example in which the place into which the screw 51 is to be screwed deviates to an upper side of the drawing, and FIG. 9 is a view illustrating an example in which the place into which the screw 51 is to be screwed deviates to a lower side of the drawing. In a case where the place into which the screw 51 is to be screwed deviates in either direction, the washer 53 can be supported by the protrusions at the three or more points, and the washer 53 can keep the substantially horizontal state.

Modified Examples of First Embodiment

Various modifications can be made in the above-described first embodiment. Hereinafter, modified examples of the first embodiment will be described.

The configuration of the embossed portion 42 can be changed as appropriate. For example, as illustrated in FIG. 10A, the embossed portion 42 may include four protrusions (protrusions 44a to 44d) provided in a rectangular shape in the peripheral portion of the hole portion 14a. Furthermore, as illustrated in FIG. 10B, the embossed portion 42 may include three protrusions (protrusions 45a to 45c) provided in a frustum shape (e.g., a quadrangular frustum) in the peripheral portion of the hole portion 14a. In other words, compared to the configuration of the embossed portion 41, the embossed portion 42 can increase the contact area of the first plate-like portion 14 and the metal chassis 30 by a predetermined amount or more, and an appropriate shape can be applied as far as the washer 53 becomes the substantially horizontal state in the state in which the screw 51 is screwed. Furthermore, a size of the washer 53 can be changed depending on the shape of the protrusions.

Furthermore, each of the protrusions may not necessarily contact the periphery of the hole portion 14a. The peripheral portion of the hole portion 14a means to include a periphery of the hole portion 14a and a place close to the periphery of the hole portion 14a in a range contacting the washer 53.

The number of antenna connectors in the tuner module 10 can be changed as appropriate. For example, the antenna connectors of the tuner module 10 may be two antenna connectors 13a and 13b as illustrated in FIG. 11A, and the antenna connectors of the tuner module 10 may also be three antenna connectors 13c, 13d, and 13e as illustrated in FIG. 11B. Furthermore, in a case where a size of the tuner casing 12 is larger, the first plate-like portion 14 may be provided inside the tuner casing 12 as illustrated in FIG. 11B. For example, a connecting portion 61 that connects the side portion SD2 and the side portion SD4 may be provided inside the tuner casing 12, and the first plate-like portion 14 may extend from the connecting portion 61 and be positioned inside the tuner casing 12.

Effects

In the first embodiment of the present disclosure, for example, the following effects can be obtained. When the tuner module using a screwing mechanism according to the present embodiment is used, a fixing portion of the screw can be prevented from being broken due to deformation or the like of the metal chassis. Therefore, the screw can be repeatedly mounted and dismounted. Therefore, it is possible to easily replace a plurality of types of tuner modules having a common mounting structure. With this configuration, variation change in the television set can be easily performed. Furthermore, since the soldering process is not necessary at the time of mounting or replacing the tuner module, it is possible to obtain effects of simplifying a cost, equipment, and tools relating to work.

Furthermore, since the tuner module incorporates a plurality of circuits, power consumption is generally increased and heat is generated. However, in the tuner module according to the present embodiment, the tuner module can be efficiently cooled because the tuner casing is directly fixed to the metal chassis. Moreover, even though high-harmonic waves of a transmission signal transmitted from, for example, a channel selection local transmitter that is a part of an electronic circuit of the tuner module become high-frequency noise, the contact point with the metal chassis located in the vicinity of the local transmitter functions as the grand point and absorbs the high-frequency noise, and unnecessary radiation can be reduced.

2. Second Embodiment

Next, a second embodiment will be described. Note that matters described in a first embodiment can be applied to a second embodiment unless particularly specified.

An F-type connector is known as a coaxial connector that is used to supply output of an antenna to an internal tuner such as a television receiver or a personal computer, in which one end of a coaxial cable is connected to the F-type connector. The F-type connector is mainly used in Japan and North America. On the other hand, in Europe, Southeast Asian countries, Middle East, and Africa, a coaxial connector mainly called international electrotechnical commission (IEC) connector is used as the coaxial connector. The F-type connector or the IEC connector can be applied as an antenna connector of a tuner module 10 in the first embodiment. As the antenna connector, the F-type connector and the IEC connector may be applied. For example, the tuner module 10 includes three antenna connectors, two antenna connectors thereof can be the F-type connectors, and the remaining one antenna connector can be the IEC connector.

Exemplary Configuration of General IEC Connector

Figure 12:
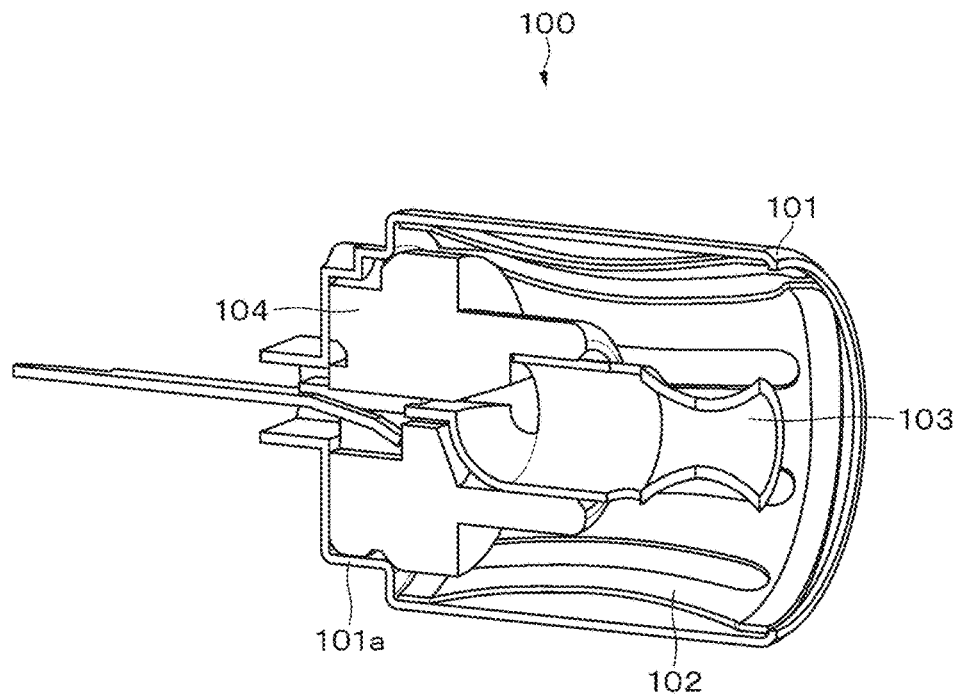
FIG. 12 is a cross-sectional view to describe a configuration of a general IEC connector.

FIG. 12 is a cross-sectional view illustrating an exemplary internal configuration of a general IEC connector. A general IEC connector 100 includes: a cylindrical metal shell 101; a cylindrical external electrode 102 incorporated inside the metal shell 101; an internal electrode (core) 103; and an insulating portion 104 as an insulator that insulates the external electrode 102 from the internal electrode 103. The insulating portion 104 is supported inside the metal shell 101 by a caulking portion 101a formed by caulking the metal shell 101. Inside the insulating portion 104, a space to house the internal electrode 103 is formed, and the internal electrode 103 is press-fitted and fixed in this space. A part of the internal electrode 103 is led out to the outside of the metal shell 101.

As described above, the insulating portion 104 is fixed by the caulking portion 101a of the metal shell 101. By the way, the insulating portion 104 contracts due to influence of heat or the like. With the contraction of the insulating portion 104, the fixation by the caulking portion 101a becomes loose, and the insulating portion 104 is vibrated by influence from external vibration. An example of the external vibration can be vibration of a speaker when loud volume is output from the speaker of a television set. Vibration of the insulating portion 104 makes the insulating portion 104 collide with the metal shell 101 and generates abnormal noise. Therefore, it is desired to suppress the vibration of the insulating portion 104 and reduce the generation of abnormal noise.

Exemplary Configuration of IEC Connector in Present Embodiment

Figure 13:
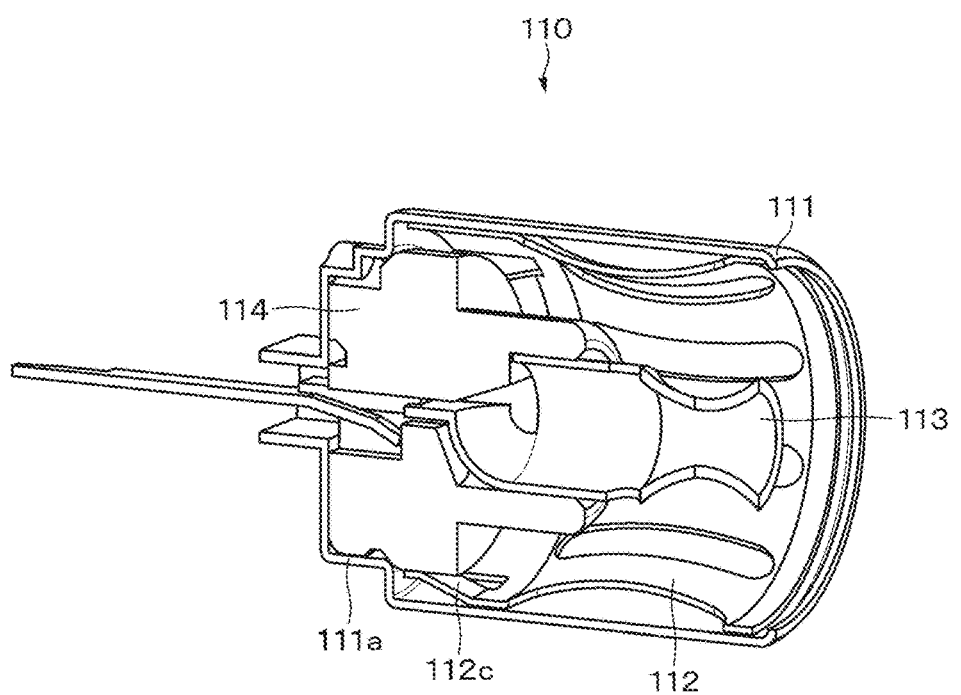
FIG. 13 is a cross-sectional view to describe an exemplary configuration of an IEC connector according to a second embodiment of the present disclosure.
Figure 14:
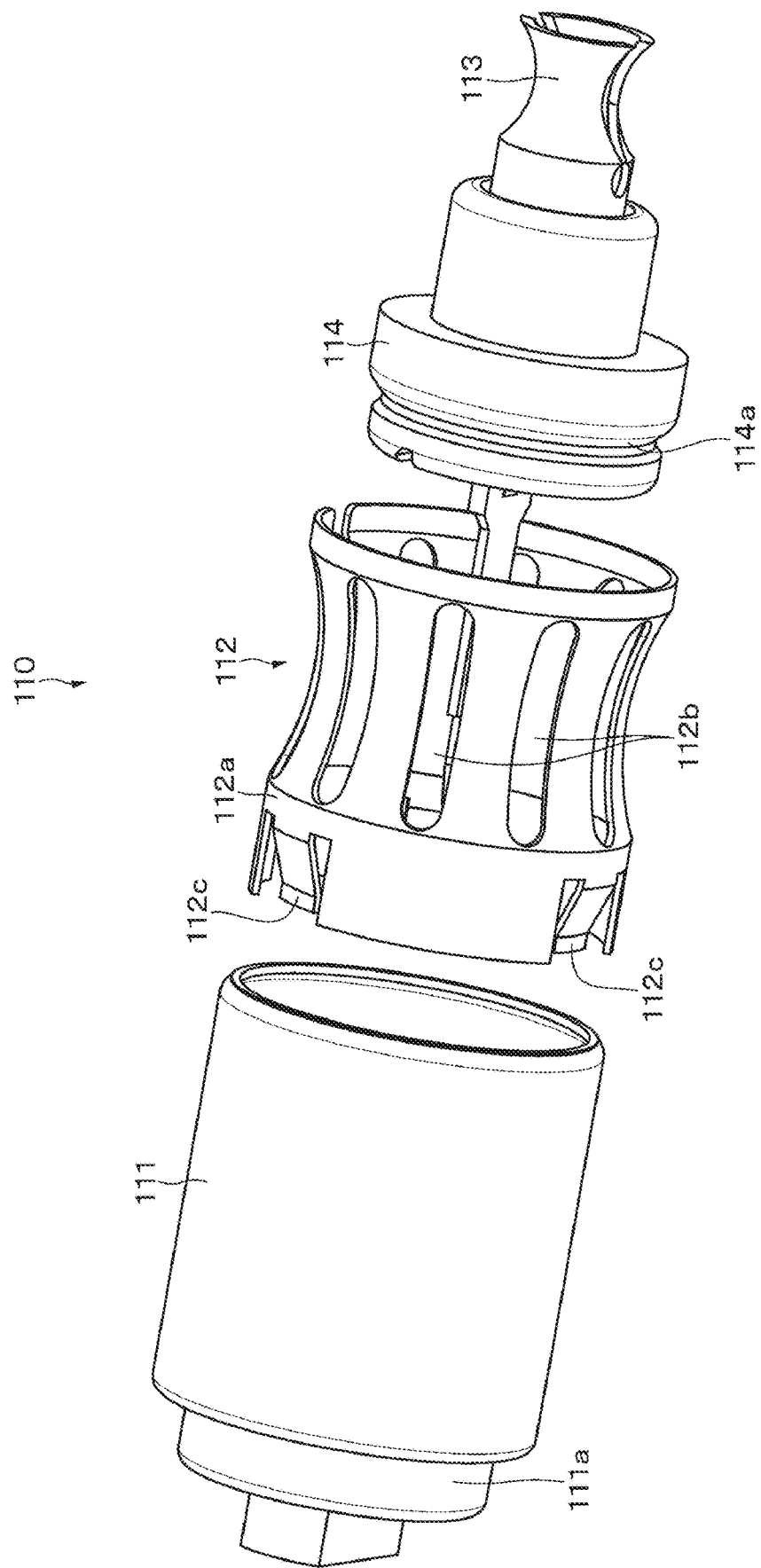
FIG. 14 is an exploded perspective view to describe the exemplary configuration of the IEC connector according to the second embodiment of the present disclosure.
Figure 15:
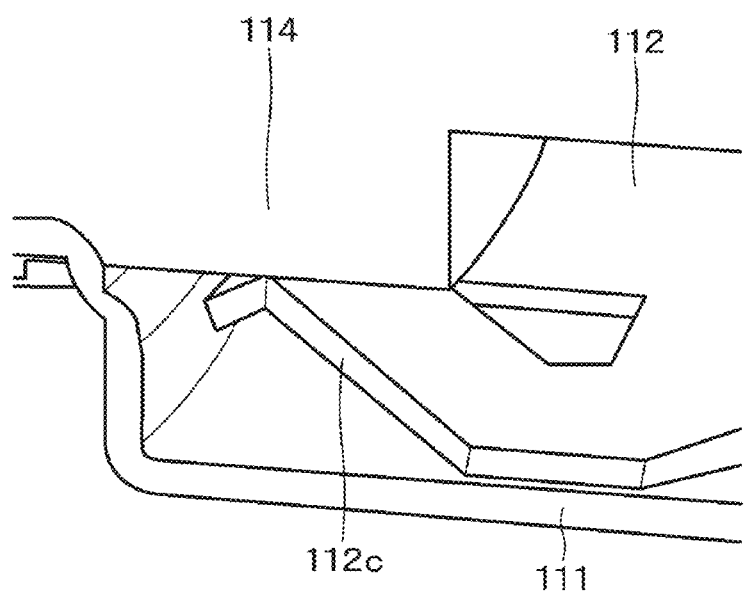
FIG. 15 is a partially enlarged view to describe the exemplary configuration of the IEC connector according to the second embodiment of the present disclosure.

An IEC connector (IEC connector 110) according to the second embodiment will be described with reference to FIGS. 13 to 15. FIG. 13 is a cross-sectional view illustrating an exemplary internal configuration of the IEC connector 110 according to the second embodiment. FIG. 14 is an exploded view to describe an exemplary configuration of the IEC connector 110 according to the second embodiment. FIG. 15 is a partially enlarged view illustrating a part of the internal configuration of the IEC connector 110 in an enlarged manner.

A basic configuration of the IEC connector 110 is the same as the above-described IEC connector 100. In other words, the IEC connector 110 includes: a cylindrical metal shell 111 as an outer casing; a cylindrical external electrode 112 (first electrode) incorporated inside the metal shell 111; and an internal electrode 113 (second electrode); and an insulating portion 114 as an insulator that insulates the external electrode 112 from the internal electrode 113, and the IEC connector 110 has a structure called a four-piece structure. The insulating portion 114 is supported inside the metal shell 111 by a caulking portion 111a formed by caulking the metal shell 111. A caulking portion 114a is formed in the insulating portion 114 in a manner corresponding to the caulking portion 111a. Inside the insulating portion 114, a space to house the internal electrode 113 is formed, and the internal electrode 113 is press-fitted and fixed in this space. A part of the internal electrode 113 is led out to the outside of the metal shell 111. The insulating portion 114 includes, for example, a resin.

As illustrated in FIG. 14, the external electrode 112 includes a base portion 112a that is cylindrical and hollow. The base portion 112a has a slightly curved shape such that the vicinity of a center portion of an inner space is slightly narrowed. A plurality of long holes 112b is formed in the vicinity of a center portion on a peripheral surface of the base portion 112a. At an end portion of the external electrode 112 (end portion located on the caulking portion 111a side), an elastic piece 112c that is slightly bent inward and can be elastically deformed is formed. For example, a plurality of elastic pieces (for example, three to five) 112c is formed at substantially equal intervals along a circumferential end portion of the external electrode 112.

When the insulating portion 114 is inserted into the external electrode 112, the elastic pieces 112c are elastically deformed slightly outward, and the insulating portion 114 is inserted in a state in which one open end of the base portion 112a is wide open. As described above, the insulating portion 114 is fixed by the caulking portion 111a of the metal shell 111. Moreover, as illustrated in FIG. 15, the insulating portion 114 is supported (fixed) by the plurality of elastic pieces 112c by resilience of the elastic pieces 112c directed toward the inside. Therefore, even in a case where strength of fixation by the caulking portion 111a is reduced due to the deformation of the metal shell 111 or the insulating portion 114, the insulating portion 114 can keep a state supported (held) by the plurality of elastic pieces 112c at a predetermined position. Therefore, the abnormal noise caused by contact between the insulating portion 114 and the metal shell 111 can be prevented. An IEC socket according to the second embodiment described above can be applied as the antenna connector of the tuner module described in the first embodiment.

3. Modified Examples

While the embodiments of the present disclosure have been specifically described above, the present disclosure is not limited to the above-described embodiments, and various kinds of modifications can be made on the basis of the technical idea of the present disclosure. The present invention can also be configured as a reception apparatus such as a television set having the tuner module of the first and second embodiments. Furthermore, the configurations, methods, processes, shapes, materials, numerical values, and the like exemplified in the above-described embodiments are merely examples, and a configuration, a method, a process, a shape, a material, a numerical value, and the like different therefrom may also be used as necessary. The above-described embodiments and modified examples can be appropriately combined.

The present disclosure can also adopt the following configurations.

(1)

A tuner module including:

a casing body adapted to house a tuner module board on which a tuner function unit is formed; and at least one antenna connector fixed to the casing body and having a terminal portion of a center electrode connected to the tuner module board, in which the casing body includes a plate-like portion formed with a hole portion into which a screw member is inserted, and a plurality of protrusions is provided apart from each other at a peripheral portion of the hole portion.

(2)

The tuner module recited in (1), in which the casing body is mounted on a metal chassis of a reception apparatus by the screw member.

(3)

The tuner module recited in (1) or (2), in which the plurality of protrusions is provided circumferentially or rectangularly.

(4)

The tuner module recited in (3), in which the five protrusions are provided circumferentially.

(5)

The tuner module recited in any one of (1) to (4), in which the casing body includes an upper surface portion, a bottom surface portion, and first to fourth side portions.

(6)

The tuner module recited in (5), in which the antenna connector is connected to the first side portion, and the plate-like portion extends in a direction toward the outside of the casing body from a side of the third side portion that is an opposite side of the first side portion.

(7)

The tuner module recited in (5), in which the plate-like portion is provided inside the casing body.

(8)

The tuner module recited in any one of (5) to (7), in which the terminal portion of the tuner module board is exposed from a side of the second side portion to an outer side of the casing body.

(9)
The tuner module recited in any one of (1) to (8), in which the casing body includes another plate-like portion including a hole portion in which a screw member common with the screw member can be mounted.

(10)
The tuner module recited in any one of (1) to (9), in which the number of the antenna connectors connected to the casing body is any one of one to three.

(11)
The tuner module recited in any one of (1) to (10), in which
the antenna connector includes a cylindrical outer casing, a cylindrical first electrode incorporated inside the outer casing, a second electrode provided inside the first electrode, and an insulating portion that supports the second electrode and insulates the first electrode from the second electrode, and
the insulator is supported by the outer casing and a plurality of elastic pieces provided on one end side of the first electrode.

(12)
A reception apparatus including: the tuner module recited in any one of (1) to (11); a metal chassis to which the tuner module is mounted by the screw member; and a board to which the tuner module board is connected.

(13)
The reception apparatus recited in (12), in which
the plurality of protrusions is formed such that the area in which the metal chassis contacts the plate-like portion is larger than the protrusions formed circumferentially, and a washer portion included in the screw member is supported substantially horizontally by the plurality of protrusions.

REFERENCE SIGNS LIST

10 Tuner module
11 Tuner module board
12 Tuner casing
13 Antenna connector
14 First plate-like portion
14a Hole portion
15 Second plate-like portion
15a Hole portion
20 Reception board
30 Metal chassis
42 Embossed portion
42a to 42e Protrusion
110 IEC connector
111 Metal shell
112 External electrode
113 Internal electrode
114 Insulating portion
TD Upper surface portion
DD Bottom surface portion
SD1 to SD4 Side portion

The invention claimed is:

1. A tuner module comprising:
a casing body configured to house a tuner module board on which a tuner function unit is formed; and
at least one antenna connector fixed to the casing body and having a terminal portion of a center electrode connected to the tuner module board, wherein
the casing body includes a first plate-like portion having a first hole portion configured to receive a first screw member,
a plurality of protrusions is provided apart from each other at a peripheral portion of the first hole portion,
the casing body is configured to be mounted on a metal chassis of a reception apparatus by the first screw member and a flat washer on the first screw member, the washer having a washer hole portion and having an outer diameter larger than a diameter of the first hole portion such that the washer abuts against the plurality of protrusions and is positioned outside the first hole portion, and
the first screw portion has a screw head with a diameter smaller than the diameter of the first hole portion and larger than the diameter of the washer hole portion such that the screw head is positioned outside the first hole portion and above the washer.

2. The tuner module according to claim 1, wherein the plurality of protrusions is provided circumferentially or rectangularly.

3. The tuner module according to claim 2, wherein the plurality of protrusions is provided circumferentially.

4. The tuner module according to claim 1, wherein the casing body includes an upper surface portion, a bottom surface portion, and first to fourth side portions.

5. The tuner module according to claim 4, wherein the antenna connector is connected to the first side portion, and
the first plate-like portion extends in a direction toward outside of the casing body from a side of the third side portion that is an opposite side of the first side portion.

6. The tuner module according to claim 4, wherein the first plate-like portion is provided inside the casing body.

7. The tuner module according to claim 4, wherein a terminal portion of the tuner module board is exposed from a side of the second side portion to an outer side of the casing body.

8. The tuner module according to claim 1, wherein the casing body includes a second plate-like portion having a second hole portion configured to receive a second screw member and wherein the first screw member and the second screw member have the same shape.

9. The tuner module according to claim 1, wherein a number of the at least one antenna connector connected to the casing body is any one of one to three.

10. The tuner module according to claim 1, wherein the antenna connector includes a cylindrical outer casing, a cylindrical first electrode incorporated inside the outer casing, a second electrode provided inside the first electrode, and an insulating portion that supports the second electrode and insulates the first electrode from the second electrode, and
the insulator is supported by the outer casing and a plurality of elastic pieces provided on one end side of the first electrode.

11. A reception apparatus comprising: the tuner module according to claim 1; the metal chassis to which the tuner module is mounted by the first screw member; and a board to which the tuner module board is connected.

12. The reception apparatus according to claim 11, wherein
the plurality of protrusions is formed such that an area in which the metal chassis contacts the first plate-like portion is larger than the protrusions formed circumferentially, and the washer is supported substantially horizontally by the plurality of protrusions.

* * * * *